US012575263B2

(12) United States Patent
Wang et al.

(10) Patent No.: US 12,575,263 B2
(45) Date of Patent: Mar. 10, 2026

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Wei Wang, Wuhan (CN); Weibin Zhang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 457 days.

(21) Appl. No.: 17/262,703

(22) PCT Filed: Oct. 23, 2020

(86) PCT No.: PCT/CN2020/123155
§ 371 (c)(1),
(2) Date: May 8, 2023

(87) PCT Pub. No.: WO2022/047921
PCT Pub. Date: Mar. 10, 2022

(65) Prior Publication Data
US 2023/0276658 A1      Aug. 31, 2023

(30) Foreign Application Priority Data
Sep. 2, 2020    (CN) .......................... 202010910990.8

(51) Int. Cl.
H10K 59/121        (2023.01)
H10D 86/40        (2025.01)
(Continued)

(52) U.S. Cl.
CPC ....... H10K 59/1213 (2023.02); H10D 86/427 (2025.01); H10D 86/60 (2025.01); H10K 59/35 (2023.02)

(58) Field of Classification Search
CPC .. H10K 59/1213; H10K 59/35; H10D 86/427; H10D 86/60
See application file for complete search history.

(56) References Cited

U.S. PATENT DOCUMENTS 9,013,098 B1 *   4/2015  Kim ..................... H10K 59/123
                                                             313/504
2006/0243974 A1    11/2006  Su et al.
(Continued)

FOREIGN PATENT DOCUMENTS

CN        105513534 A      4/2016
CN        110729332 A      1/2020
(Continued)

OTHER PUBLICATIONS

International Search Report in International application No. PCT/CN2020/123155, mailed on Jun. 9, 2021.
(Continued)

*Primary Examiner* — Michael Lebentritt
(74) *Attorney, Agent, or Firm* — PV IP PC; Christopher S. Ruprecht; Wei Te Chung

(57)        ABSTRACT
The present invention provides a display panel. In the display panel, a first driving thin-film transistor is electrically connected to a first organic light-emitting diode (OLED) device, and a second driving thin-film transistor is electrically connected to a second organic light-emitting diode (OLED) device; the first driving thin-film transistor includes a first active layer, and a channel portion of the first active layer has a first aspect ratio; the second driving thin-film transistor includes a second active layer, and a channel portion of the second active layer has a second
(Continued)

aspect ratio; and the first aspect ratio is smaller than the second aspect ratio.

16 Claims, 2 Drawing Sheets

(51) Int. Cl.
H10D 86/60 (2025.01)
H10K 59/35 (2023.01)

(56) References Cited

U.S. PATENT DOCUMENTS

| | | | |
|---|---|---|---|
| 2013/0063330 A1 | 3/2013 | Eom | |
| 2015/0116191 A1* | 4/2015 | Qi ........................ | G09G 3/3233 |
| | | | 345/76 |
| 2016/0322445 A1 | 11/2016 | Lee et al. | |
| 2020/0286432 A1* | 9/2020 | Zhang .................. | G09G 3/3258 |

FOREIGN PATENT DOCUMENTS

| | | | |
|---|---|---|---|
| CN | 111180492 A | 5/2020 | |
| CN | 112086468 A * | 12/2020 | ............. H10D 86/60 |

OTHER PUBLICATIONS

Written Opinion of the International Search Authority in International application No. PCT/CN2020/123155, mailed on Jun. 9, 2021.
Chinese Office Action in corresponding Chinese Patent Application No. 202010910990.8 dated Apr. 27, 2022, pp. 1-8.

\* cited by examiner

DISPLAY PANEL

RELATED APPLICATIONS

This application is a Notional Phase of PCT Patent Application No. PCT/CN2020/123155 having international filing date of Oct. 23, 2020, which claims the benefit of priority of Chinese Patent Application No. 202010910990.8 filed on Sep. 2, 2020. The contents of the above applications are all incorporated by reference as if fully set forth herein in their entirety.

FIELD OF INVENTION

The present invention relates to the field of display technology, in particular to a display panel.

DESCRIPTION OF PRIOR ART

In an active-matrix organic light-emitting diode (AMO-LED) display panel, AMOLED is driven by current controlled by thin film transistor (TFT). Because thin-film transistors made by low-temperature polysilicon technology have serious hysteresis effects, causing fluctuations in the output current of the transistors, the brightness of the OLED device controlled by the output current will deviate from the design value. Such an effect is reflected in a display image as an afterimage, and the afterimage level of the image is strongly correlated with the image per se; that is, under the same gray scale, the afterimage phenomenon of a green image is serious, and the afterimage phenomenon of a red image is relatively light.

SUMMARY OF INVENTION

Technical Problem

An embodiment of the present invention provides a display panel to solve the technical problem that thin-film transistors made by low-temperature polysilicon technology in existing OLED panels have serious hysteresis effects, which will cause fluctuations in the output current of the transistors, resulting in afterimages in a green image and/or a red image under the same gray scale.

Solution to Problem

Technical Solution

An embodiment of the present invention provides a display panel, including a first driving thin-film transistor, a second driving thin-film transistor, a first organic light-emitting diode (OLED) device, and a second organic light-emitting diode (OLED) device, wherein the first driving thin-film transistor is electrically connected to the first OLED device, the second driving thin-film transistor is electrically connected to the second OLED device, and the first OLED device and the second OLED device emit light of different colors;

the first driving thin-film transistor includes a first active layer, and a channel portion of the first active layer has a first aspect ratio; the second driving thin-film transistor includes a second active layer, and a channel portion of the second active layer has a second aspect ratio;

the first aspect ratio is smaller than the second aspect ratio; a width of the channel portion of the first active layer ranges between 1.5 microns and 4 microns, and a length of the channel portion of the first active layer ranges between 15 microns and 50 microns; and the first OLED device is a green OLED device, and the second OLED device is a first non-green OLED device.

In the display panel according to an embodiment of the present invention, the display panel further includes a third driving thin-film transistor and a second non-green OLED device, the second non-green OLED device and the first non-green OLED device emit light of different colors, and the third driving thin-film transistor is electrically connected to the second non-green OLED device;

the third driving thin-film transistor includes a third active layer, and a channel portion of the third active layer has a third aspect ratio; and the first aspect ratio is smaller than the third aspect ratio.

In the display panel according to an embodiment of the present invention, the first non-green OLED device is one of a red OLED device and a blue OLED device, and the second non-green OLED device is another one of a red OLED device and a blue OLED device.

In the display panel according to an embodiment of the present invention, the second aspect ratio is equal to the third aspect ratio.

In the display panel according to an embodiment of the present invention, the first non-green OLED device is a red OLED device, and the second non-green OLED device is a blue OLED device; and the second aspect ratio is smaller than the third aspect ratio.

In the display panel according to an embodiment of the present invention, the first driving thin-film transistor includes a first gate, the second driving thin-film transistor includes a second gate; and an area of the channel portion of the first active layer covered by the first gate is larger than an area of the channel portion of the second active layer covered by the second gate.

In the display panel according to an embodiment of the present invention, the third driving thin-film transistor includes a third gate, and an area of the channel portion of the second active layer covered by the first gate is larger than an area of the channel portion of the third active layer covered by the third gate.

In the display panel according to an embodiment of the present invention, the display panel further includes a first capacitor, wherein the first capacitor includes a first electrode and a second electrode disposed on the first electrode, and the first capacitor is the first gate; and a second capacitor, wherein the second capacitor includes a third electrode and a fourth electrode disposed on the third electrode, and the third electrode is the second gate, wherein an area of the second electrode is smaller than an area of the fourth electrode.

In the display panel according to an embodiment of the present invention, the display panel further includes a third capacitor, the third capacitor includes a fifth electrode and a sixth electrode disposed on the fifth electrode, the fifth electrode is the third gate; and the area of the second electrode is smaller than an area of the sixth electrode.

Another embodiment of the present invention also provides a display panel, including a first driving thin-film transistor, a second driving thin-film transistor, a first organic light-emitting diode (OLED) device, and a second organic light-emitting diode (OLED) device, wherein the first driving thin-film transistor is electrically connected to the first OLED device, the second driving thin-film transistor is electrically connected to the second OLED device, and the first OLED device and the second OLED device emit light of different colors;

the first driving thin-film transistor includes a first active layer, and a channel portion of the first active layer has a first aspect ratio; the second driving thin-film transistor includes a second active layer, and a channel portion of the second active layer has a second aspect ratio; and the first aspect ratio is smaller than the second aspect ratio.

In the display panel according to an embodiment of the present invention, the first OLED device is a green OLED device, and the second OLED device is a first non-green OLED device.

In the display panel according to an embodiment of the present invention, the display panel further includes a third driving thin-film transistor and a second non-green OLED device, the second non-green OLED device and the first non-green OLED device emit light of different colors, and the third driving thin-film transistor is electrically connected to the second non-green OLED device;

the third driving thin-film transistor includes a third active layer, and a channel portion of the third active layer has a third aspect ratio; and the first aspect ratio is smaller than the third aspect ratio.

In the display panel according to an embodiment of the present invention, the first non-green OLED device is one of a red OLED device and a blue OLED device, and the second non-green OLED device is another one of a red OLED device and a blue OLED device.

In the display panel according to an embodiment of the present invention, the second aspect ratio is equal to the third aspect ratio.

In the display panel according to an embodiment of the present invention, the first non-green OLED device is a red OLED device, and the second non-green OLED device is a blue OLED device; and the second aspect ratio is smaller than the third aspect ratio.

In the display panel according to an embodiment of the present invention, the first driving thin-film transistor includes a first gate, the second driving thin-film transistor includes a second gate; and an area of the channel portion of the first active layer covered by the first gate is larger than an area of the channel portion of the second active layer covered by the second gate.

In the display panel according to an embodiment of the present invention, the third driving thin-film transistor includes a third gate, and an area of the channel portion of the second active layer covered by the first gate is larger than an area of the channel portion of the third active layer covered by the third gate.

In the display panel according to an embodiment of the present invention, the display panel further includes a first capacitor, wherein the first capacitor includes a first electrode and a second electrode disposed on the first electrode, and the first capacitor is the first gate; and a second capacitor, wherein the second capacitor includes a third electrode and a fourth electrode disposed on the third electrode, and the third electrode is the second gate, wherein an area of the second electrode is smaller than an area of the fourth electrode.

In the display panel according to an embodiment of the present invention, the display panel further includes a third capacitor, the third capacitor includes a fifth electrode and a sixth electrode disposed on the fifth electrode, the fifth electrode is the third gate; and the area of the second electrode is smaller than an area of the sixth electrode.

In the display panel according to an embodiment of the present invention, the first aspect ratio is smaller than the second aspect ratio; a width of the channel portion of the first active layer ranges between 1.5 microns and 4 microns, and a length of the channel portion of the first active layer ranges between 15 microns and 50 microns.

Advantageous Effect

In the display panel of the present invention, the aspect ratio of the channel portion of the first active layer of the first driving thin-film transistor of the first OLED device is set to be the first aspect ratio, and the aspect ratio of the channel portion of the second active layer of the second driving thin-film transistor of the second OLED device is set to be the second aspect ratio, wherein the first aspect ratio is set to be smaller than the second aspect ratio to change the electrical properties of the first driving thin-film transistor, thereby alleviating the afterimage phenomenon of an image.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
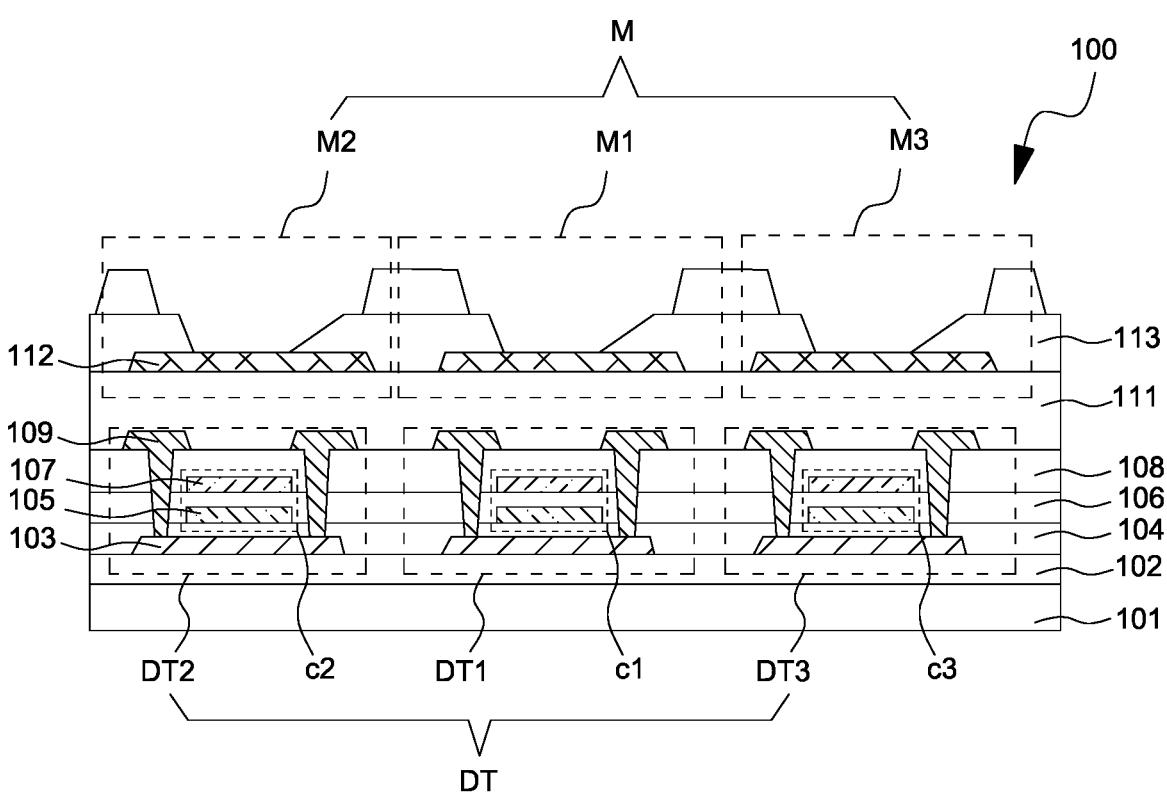
FIG. 1 is a schematic cross-sectional structure diagram of a display panel according to an embodiment of the present invention.

Referring to the figures in the drawings, in which, like numbers refer to like elements throughout the description of the figures. Hereinafter, the present invention will be described in further detail with reference to examples. It is to be understood, however, that these examples are for illustrative purposes only and are not intended to limit the scope of the present invention.

In the description of the present invention, it is to be understood that the terms "center", "longitudinal", "transverse", "length", "width", "thickness", "upper", "lower", "front", "post", "left", "right", "vertical", "horizontal", "top", "bottom", "inside", "outside", etc. demonstrating the orientation or positional relationship of the indications is based on the orientation shown in the drawings Or, the positional relationship is merely for the convenience of the description of the present invention and the simplification of the description, and is not intended to imply that the device or the component of the present invention has a specific orientation and is constructed and operated in a specific orientation, thus being not to be construed as limiting the present invention. Moreover, the terms "first" and "second" are used for descriptive purposes only and are not to be construed as indicating or implying a relative importance or not to implicitly indicate a number of technical features indicated. Thus, features defined by "first" or "second" may include one or more of the described features either explicitly or implicitly.

In the description of the present invention, it should be noted that the terms "installation", "connection", and "bonding" are to be understood broadly unless otherwise explicitly defined and limited. For example, it may be fixed connection, detachable connection, or integrally connection; being mechanical or electrical connection; also, being directly connection, indirectly connection through an intermediate medium, or internal communication of two components. The specific meaning of the above terms in the present invention can be understood in a specific case by those skilled in the art.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature.

The following disclosure provides many different embodiments or examples for realizing different structures of the present application. To simplify the disclosure of the present application, the components and settings of specific examples are described below. Of course, they are only examples and are not intended to limit the application. In addition, the present application may repeat reference numerals and/or reference letters in different examples. Such repetition is for the purpose of simplification and clarity, and does not indicate the relationship between the various embodiments and/or settings discussed. In addition, this application provides examples of various specific processes and materials, but those of ordinary skill in the art may be aware of the applications of other processes and/or the use of other materials.

Referring to FIG. 1, FIG. 1 is a schematic cross-sectional structure diagram of a display panel according to an embodiment of the present invention. An embodiment of the present invention provides a display panel 100, which includes an OLED device layer M and a driving thin-film transistor structure layer DT, wherein the driving thin-film transistor structure layer DT is electrically connected to the OLED device layer M. The driving thin-film transistor structure layer DT is configured to transport current to the OLED device layer M to drive the OLED device layer M to emit light.

Optionally, the driving thin-film transistor structure layer DT can be applied to a seven transistors and one capacitor (7T1C) pixel driving circuit and a six transistors and one capacitor (6T1C) pixel driving circuit, or other pixel driving circuits. This embodiment takes a 7T1C pixel driving circuit as an example for illustration, but it is not particularly limited thereto.

Figure 2:
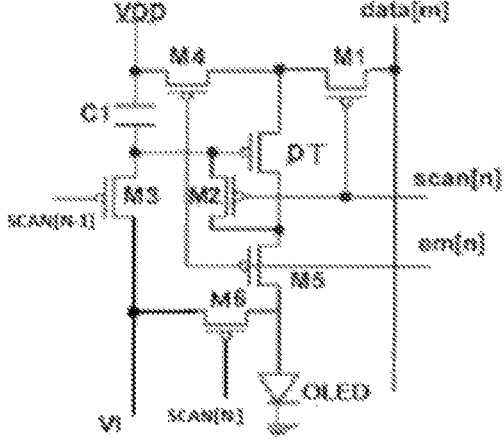
FIG. 2 is an equivalent diagram of a pixel driving circuit of a display panel according to an embodiment of the present invention.

As shown in FIG. 2, a gate of the driving thin-film transistor DT is electrically connected to a first terminal of a second thin-film transistor M2, an terminal of a capacitor C1, and a first terminal of a third thin-film transistor M3; a first terminal of the driving thin-film transistor DT is electrically connected to a second terminal of the first thin-film transistor M1 and a first terminal of the fourth thin-film transistor M4; a second terminal of the driving thin-film transistor DT is electrically connected to a first terminal of the fifth thin-film transistor M5 and second terminal of the second thin-film transistor M2.

A gate of the fifth thin-film transistor M5 is electrically connected to a gate of the fourth thin-film transistor M4 and a signal line em[n]; a second terminal of the fifth thin-film transistor M5 is electrically connected to a second terminal of the sixth thin-film transistor M6 and the OLED device, respectively. Another terminal of the capacitor C1 is electrically connected to a voltage line VDD and a second terminal of the fourth thin-film transistor M4, respectively.

The first terminal of the first thin-film transistor M1 is electrically connected to a data line data[m]; a gate of the first thin-film transistor M1 is electrically connected to a second scan line scan[n] and a gate of the second thin-film transistor M2, respectively. A gate of the third thin-film transistor M3 is electrically connected to a first scan line scan[n-1]; a second terminal of the third thin-film transistor M3 is electrically connected to a first terminal of the sixth thin-film transistor M6; and a gate of the sixth thin-film transistor M6 is electrically connected to the second scan line scan[n].

Specifically, the driving thin-film transistor structure layer DT includes a buffer layer 102, an active layer 103, a first insulating layer 104, a first gate metal layer 105, a second insulating layer 106, and a second gate metal layer 107, an interlayer dielectric layer 108, and a source/drain metal layer 109 which are sequentially formed on the substrate 101.

Figure 3:
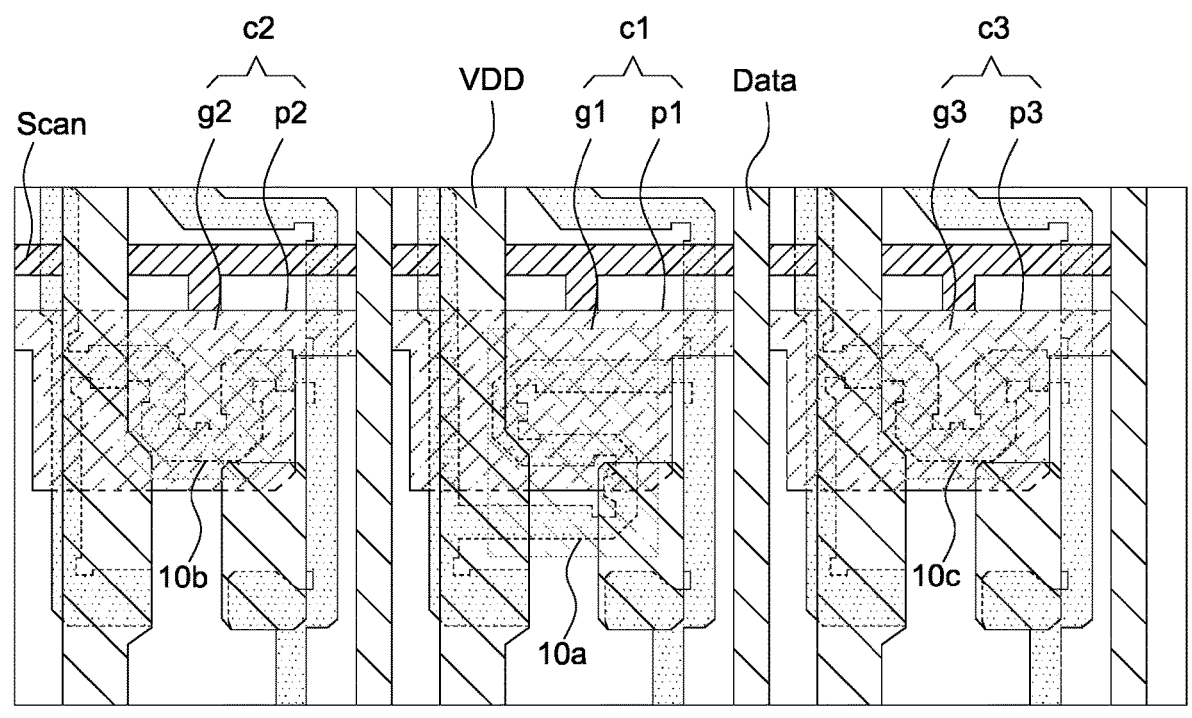
FIG. 3 is a schematic structural top view of driving thin-film transistors and signal lines of a display panel according to an embodiment of the present invention.

As shown in FIG. 3, the first gate metal layer 105 includes a scan line Scan, a first gate g1, a second gate g2, and a third gate g3. The second gate metal layer 107 includes a second electrode p1, a fourth electrode p2, and a sixth electrode p3.

The first gate g1 overlaps the second electrode p1 to form a first capacitor c1. The second gate g2 overlaps the fourth electrode p2 to form a second capacitor c2. The third gate g3 overlaps the sixth electrode p3 to form a third capacitor c3.

The source/drain metal layer 109 includes a data line Data, a power line VDD, a source electrode, and a drain electrode. The power line VDD is electrically connected to the capacitor.

The OLED device layer M includes a planarization layer 111, an anode 112, and a pixel definition layer 113 that are sequentially formed on the source/drain metal layer 109. Of course, in this embodiment, the OLED device M further includes an organic light-emitting layer, a cathode, and an encapsulation layer sequentially disposed on the anode 112.

As shown in FIG. 1, the driving thin-film transistor structure layer DT includes a first driving thin-film transistor DT1 and a second driving thin-film transistor DT2. The OLED device layer M includes a first OLED device M1 and a second OLED device M2. The first driving thin-film transistor DT1 is electrically connected to the first OLED device M1. The second driving thin-film transistor DT2 is electrically connected to the second OLED device M2. The first OLED device M1 and the second OLED device M2 emit light of different colors.

The first driving thin-film transistor DT1 includes a first active layer 10a. A channel portion of the first active layer 10a has a first aspect ratio. The second driving thin-film transistor DT1 includes a second active layer 10b, and a channel portion of the second active layer 10b has a second aspect ratio.

The first aspect ratio is smaller than the second aspect ratio.

Figure 4:
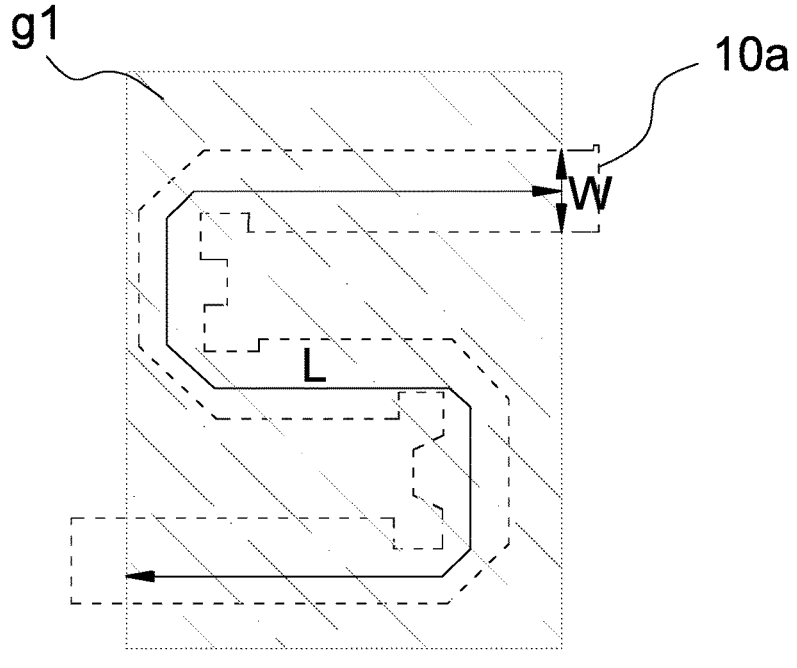
FIG. 4 is a schematic diagram of the structure of a channel portion and the first gate of the first active layer of the display panel according to an embodiment of the present invention.

It should be noted that the aspect ratio is a ratio of a width to a length. As shown in FIG. 4, for example, a width of the channel portion of the first active layer 10a is W, and a length of the channel portion of the first active layer 10a is L, such that the first aspect ratio is W/L.

In the display panel 100 of this embodiment, the aspect ratio of the channel portion of the first active layer 10a of the first driving thin-film transistor DT1 of the first OLED device M1 is set to be the first aspect ratio, and the aspect ratio of the channel portion of the second active layer 10b of the second driving thin-film transistor DT2 of the second OLED device M2 is set to be the second aspect ratio, wherein the first aspect ratio is set to be smaller than the second aspect ratio to change the electrical properties of the first driving thin-film transistor, thereby alleviating the afterimage phenomenon of an image.

Optionally, the first OLED device M1 is a green OLED device, and the second OLED device M2 is a first non-green OLED device, such that the afterimage phenomenon of the green image can be improved.

Optionally, the width of the channel portion of the first active layer 10a ranges between 1.5 microns and 4 microns, and the length of the channel portion of the first active layer 10a ranges between 15 microns and 50 microns.

Optionally, the channel portion of the first active layer 10a may have one of an "S" shape, a "U" shape, or a "Z" shape, but it is not particularly limited thereto. In this embodiment, the channel portion of the first active layer 10a has an "S" shape, wherein the "S"-shaped reciprocating bending structure can shorten a wiring space and improve the bending performance; and the intermediate chamfer shape at a bending connection portion of the "S"-shaped structure can reduce the bending stress concentration.

In the display panel 100 of this embodiment, the driving thin-film transistor structure layer DT further includes a third driving thin-film transistor DT3. The OLED device layer M further includes a second non-green OLED device M3, and the second non-green OLED device M3 and the first non-green OLED device M2 respectively emit light in different colors. The third driving thin-film transistor DT3 is electrically connected to the second non-green OLED device M3.

The third driving thin-film transistor DT3 includes a third active layer 10c, and a channel portion of the third active layer 10c has a third aspect ratio.

The first aspect ratio is smaller than the third aspect ratio, so as to further change the electrical properties of the first driving thin-film transistor DT1, thereby alleviating the afterimage phenomenon of the green image.

In the display panel 100 described in this embodiment, the first non-green OLED device M2 is one of a red OLED device and a blue OLED device, and the second non-green OLED device M3 is a red OLED device and a blue OLED device. The other one of the color OLED devices.

Optionally, in the display panel described in this embodiment, the first non-green OLED device M2 is a red OLED device. The second non-green OLED device M3 is a blue OLED device.

The second aspect ratio is equal to the third aspect ratio, which on the one hand saves space to arrange the first active layer 10a; and on the other hand, facilitates the layout of a mask. In addition, when the second aspect ratio and the third aspect ratio are both 3.3/25.5, the afterimages of the red image and the blue image are relatively slight, thus not impacting the display effect to a certain extent.

It can be appreciated that under a requirement of the same brightness, among the red OLED device, the green OLED device M1, and the blue OLED device, the blue OLED device requires the largest driving current, the red OLED device requires the second largest driving current, and the green OLED device M1 requires the smallest driving current.

Therefore, in the display panel of some embodiments, the first aspect ratio is smaller than the second aspect ratio, and the second aspect ratio is smaller than the third aspect ratio. As such, on the one hand, currents for the OLED devices of three colors respectively to emit light are ensured, thereby improving the uniformity of the luminous brightness; and on the other hand, the hysteresis effect of the first driving thin-film transistor DT1 and the second driving thin-film transistor DT2 is reduced, thereby alleviating the afterimage phenomenon of the green image and the red image corresponding to the green OLED device and the red OLED device, respectively.

Optionally, in this embodiment, a width of the channel portion of the second active layer 10b and a width of the channel portion of the third active layer 10c are both between 1.5 microns and 4 microns, and a length of the channel portion of the second active layer 10b and a length of the channel portion of the third active layer 10c are both between 15 microns and 50 microns.

Optionally, the channel portion of the second active layer 10b and the channel portion of the third active layer 10c may have one of an "S" shape, a "U" shape, or a "Z" shape, but not particularly limited thereto. In this embodiment, the channel portion of the second active layer 10b and the channel portion of the third active layer 10c are both "U" shaped.

Specifically, in the display panel 100 of this embodiment, the channel portion of the first active layer 10a has an "S" shape, and the first aspect ratio is 2.7/46, that is, the width is 2.7 microns, and the length is 46 microns; and the channel portions of the second active layer 10b and the third active layer 10c are both "U" shaped, and have the same aspect ratio of 3.3/25.5, that is, the width is 3.3 microns and the length is 25.5 microns.

For another example, the channel portion of the first active layer 10a has a "U" shape, and the first aspect ratio is 2.5/42, that is, the width is 2.5 microns and the length is 42 microns; and the channel portions of the second active layer 10b and the third active layer 10c are both "U" shaped, and have the same aspect ratio of 3.3/25.5, that is, the width is 3.3 microns and the length is 25.5 microns.

Of course, in the display panel 100 of this embodiment, the shape of the channel portion and the first aspect ratio of the first active layer 10a, the shape of the channel portion and the second aspect ratio, of the second active layer 10b, and shape of the channel portion and the third aspect ratio of the third active layer 10c are not particularly limited thereto.

In addition, in the display panel 100 of this embodiment, the first driving thin-film transistor DT1 includes a first gate g1, the second driving thin-film transistor DT2 includes a second gate g2, and the third driving thin-film transistor DT3 includes a third gate g3.

An area of the channel portion of the first active layer 10s covered by the first gate g1 is larger than an area of the channel portion of the second active layer 10b covered by the second gate g2. The area of the channel portion of the first active layer 10s covered by the first gate g1 is larger than an area of the channel portion of the third active layer 10c covered by the third gate g3.

Such arrangement ensures the effectiveness of the channel portion of the first active layer 10a.

In the display panel 100 of this embodiment, the display panel 100 further includes a first capacitor c1. The first capacitor c1 includes a first electrode and a second electrode p1 disposed on the first electrode. The first electrode is the first gate g1. The first capacitor c1 is electrically connected to the first driving thin-film transistor DT1.

The display panel 100 further includes a second capacitor c2. The second capacitor c2 includes a third electrode and a fourth electrode p2 arranged on the third electrode. The third electrode is the second gate g2. The second capacitor c2 is electrically connected to the second driving thin-film transistor DT2.

The display panel 100 further includes a third capacitor c3. The third capacitor c3 includes a fifth electrode and a sixth electrode p3 arranged on the fifth electrode. The fifth electrode is the third gate g3. The third capacitor c3 is electrically connected to the third driving thin-film transistor DT3.

An area of the second electrode p1 is smaller than an area of the fourth electrode p2. The area of the second electrode p1 is smaller than an area of the sixth electrode p3.

When the area of the first electrode is larger than that of the third electrode or the fifth electrode, in order to maintain the consistency between the first capacitor c1, the second capacitor c2, and the third capacitor c3, the area of the second electrode p1 needs to be reduced accordingly.

In this embodiment, optionally, the area of the fourth electrode p2 is equal to the area of the sixth electrode p3, but it is not particularly limited thereto, that is, the area of the fourth electrode p2 and the area of the six electrode p3 may not be equal.

In the display panel of the present invention, the aspect ratio of the channel portion of the first active layer of the first driving thin-film transistor of the first OLED device is set to be the first aspect ratio, and the aspect ratio of the channel portion of the second active layer of the second driving thin-film transistor of the second OLED device is set to be the second aspect ratio, wherein the first aspect ratio is set to be smaller than the second aspect ratio to change the electrical properties of the first driving thin-film transistor, thereby alleviating the afterimage phenomenon of an image.

The display panel provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising a first driving thin-film transistor, a second driving thin-film transistor, a first organic light-emitting diode (OLED) device, and a second organic light-emitting diode (OLED) device, wherein the first driving thin-film transistor is electrically connected to the first OLED device, the second driving thin-film transistor is electrically connected to the second OLED device, and the first OLED device and the second OLED device emit light of different colors;

the first driving thin-film transistor comprises a first active layer, and a channel portion of the first active layer has a first aspect ratio; the second driving thin-film transistor comprises a second active layer, and a channel portion of the second active layer has a second aspect ratio;

a width of the channel portion of the first active layer ranges between 1.5 microns and 4 microns, and a length of the channel portion of the first active layer ranges between 15 microns and 50 microns;

the first OLED device is a green OLED device, and the second OLED device is a first non-green OLED device; and the first aspect ratio of the first driving thin-film transistor electrically connected to the green OLED device is smaller than the second aspect ratio of the second driving thin-film transistor electrically connected to the first non-green OLED device;

wherein the display panel further comprises a third driving thin-film transistor and a second non-green OLED device, the second non-green OLED device and the first non-green OLED device emit light of different colors, respectively, and the third driving thin-film transistor is electrically connected to the second non-green OLED device;

the third driving thin-film transistor comprises a third active layer, and a channel portion of the third active layer has a third aspect ratio; and the first aspect ratio is smaller than the third aspect ratio;

wherein the first non-green OLED device is one of a red OLED device and a blue OLED device, and the second non-green OLED device is another one of a red OLED device and a blue OLED device; and wherein the second aspect ratio is equal to the third aspect ratio.

2. The display panel according to claim 1, wherein the first non-green OLED device is a red OLED device, and the second non-green OLED device is a blue OLED device.

3. The display panel according to claim 1, wherein the first driving thin-film transistor comprises a first gate, the second driving thin-film transistor comprises a second gate; and an area of the channel portion of the first active layer covered by the first gate is larger than an area of the channel portion of the second active layer covered by the second gate.

4. The display panel according to claim 3, wherein the third driving thin-film transistor comprises a third gate, and an area of the channel portion of the second active layer covered by the first gate is larger than an area of the channel portion of the third active layer covered by the third gate.

5. The display panel according to claim 4, wherein the display panel further comprises a first capacitor, wherein the first capacitor comprises a first electrode and a second electrode disposed on the first electrode, and the first capacitor is the first gate; and a second capacitor, wherein the second capacitor comprises a third electrode and a fourth electrode disposed on the third electrode, and the third electrode is the second gate, wherein an area of the second electrode is smaller than an area of the fourth electrode.

6. The display panel according to claim 5, wherein the display panel further comprises a third capacitor, the third capacitor comprises a fifth electrode and a sixth electrode disposed on the fifth electrode, the fifth electrode is the third gate; and the area of the second electrode is smaller than an area of the sixth electrode.

7. A display panel, comprising a first driving thin-film transistor, a second driving thin-film transistor, a first organic light-emitting diode (OLED) device, and a second organic light-emitting diode (OLED) device, wherein the first driving thin-film transistor is electrically connected to the first OLED device, the second driving thin-film transistor is electrically connected to the second OLED device, and the first OLED device and the second OLED device emit light of different colors;

the first driving thin-film transistor comprises a first active layer, and a channel portion of the first active layer has a first aspect ratio; the second driving thin-film transistor comprises a second active layer, and a channel portion of the second active layer has a second aspect ratio;

the first OLED device is a green OLED device, and the second OLED device is a first non-green OLED device; and the first aspect ratio of the first driving thin-film transistor electrically connected to the green OLED device is smaller than the second aspect ratio of the second driving thin-film transistor electrically connected to the first non-green OLED device.

8. The display panel according to claim 7, wherein the display panel further comprises a third driving thin-film transistor and a second non-green OLED device, the second non-green OLED device and the first non-green OLED device emit light of different colors, and the third driving thin-film transistor is electrically connected to the second non-green OLED device;

the third driving thin-film transistor comprises a third active layer, and a channel portion of the third active layer has a third aspect ratio; and the first aspect ratio is smaller than the third aspect ratio.

9. The display panel according to claim 8, wherein the first non-green OLED device is one of a red OLED device and a blue OLED device, and the second non-green OLED device is another one of a red OLED device and a blue OLED device.

10. The display panel according to claim 9, wherein the second aspect ratio is equal to the third aspect ratio.

11. The display panel according to claim 9, wherein the first non-green OLED device is a red OLED device, and the second non-green OLED device is a blue OLED device; and the second aspect ratio is smaller than the third aspect ratio.

12. The display panel according to claim 8, wherein the first driving thin-film transistor comprises a first gate, the second driving thin-film transistor comprises a second gate; and an area of the channel portion of the first active layer covered by the first gate is larger than an area of the channel portion of the second active layer covered by the second gate.

13. The display panel according to claim 12, wherein the third driving thin-film transistor comprises a third gate, and an area of the channel portion of the second active layer covered by the first gate is larger than an area of the channel portion of the third active layer covered by the third gate.

14. The display panel according to claim 13, wherein the display panel further comprises a first capacitor, wherein the first capacitor comprises a first electrode and a second electrode disposed on the first electrode, and the first capacitor is the first gate; and a second capacitor, wherein the second capacitor comprises a third electrode and a fourth electrode disposed on the third electrode, and the third electrode is the second gate, wherein an area of the second electrode is smaller than an area of the fourth electrode.

15. The display panel according to claim 14, wherein the display panel further comprises a third capacitor, the third capacitor comprises a fifth electrode and a sixth electrode disposed on the fifth electrode, the fifth electrode is the third gate; and the area of the second electrode is smaller than an area of the sixth electrode.

16. The display panel according to claim 7, wherein the first aspect ratio is smaller than the second aspect ratio; a width of the channel portion of the first active layer ranges between 1.5 microns and 4 microns, and a length of the channel portion of the first active layer ranges between 15 microns and 50 microns.

* * * * *